(12) United States Patent
Huang

(10) Patent No.: US 6,396,139 B1
(45) Date of Patent: May 28, 2002

(54) SEMICONDUCTOR PACKAGE STRUCTURE WITH EXPOSED DIE PAD

(75) Inventor: Chien-Ping Huang, Taiwan (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/624,065

(22) Filed: Jul. 24, 2000

(30) Foreign Application Priority Data

Apr. 1, 2000 (TW) ......................... 89106138 A

(51) Int. Cl.⁷ .............................................. H01L 23/48
(52) U.S. Cl. ................... 257/696; 257/684; 257/676; 257/693; 257/692; 257/690
(58) Field of Search ................... 257/696, 675, 257/666, 684, 676, 672, 706, 782

(56) References Cited

U.S. PATENT DOCUMENTS

| | | | |
|---|---|---|---|
| 5,252,783 A | | 10/1993 | Baird ......................... 174/522 |
| 6,075,282 A | * | 6/2000 | Champagne ................ 257/675 |
| 6,114,752 A | * | 9/2000 | Huang et al. ................ 257/666 |
| 6,208,023 B1 | * | 3/2001 | Nakayama et al. ......... 257/696 |
| 6,229,200 B1 | * | 5/2001 | Mclellan et al. ............ 257/666 |

* cited by examiner

Primary Examiner—David Nelms
Assistant Examiner—Tu-Tu Ho
(74) Attorney, Agent, or Firm—Peter F. Corless; Steven M. Jensen; Edwards & Angell, LLP

(57) ABSTRACT

A semiconductor package structure with exposed die pad is proposed. The proposed package structure comprises a lead frame having a die pad and a plurality of leads, with the bottom surface being formed with a cutaway portion at the peripheral edge thereof; a semiconductor chip mounted on the front surface of the die pad and electrically coupled to the leads; and an encapsulation body for encapsulating the semiconductor chip and part of the leads, with the bottom surface of the die pad being exposed to the outside of the encapsulation body. The cutaway portion can serve as a constricted passage when the die pad is clamped between a pair of encapsulating molds, so that the molding resin injected into the encapsulating molds would be slowed down in flow speed within the cutaway portion since the molding resin within the cutaway portion would be able to more quickly absorb the heat of the molds, thereby increasing its viscosity so that the molding resin would be less likely to flash onto the bottom surface of the die pad. As a result, the finished semiconductor package structure would be more cost-effective to implement and more assured in quality and reliability.

7 Claims, 2 Drawing Sheets

SEMICONDUCTOR PACKAGE STRUCTURE WITH EXPOSED DIE PAD

BACKGROUND OF THE INVENTION

1. Field of the Invention

This invention relates to semiconductor packaging technology, and more particularly, to a semiconductor package structure of the type utilizing lead frame as chip carrier.

2. Description of Related Art

A semiconductor package structure that utilizes lead frame as chip carrier is typically configured in such a manner as to mount the semiconductor chip on the die pad of the lead frame and then encapsulate the entire chip with a resin-made encapsulation body. The semiconductor chip is electrically coupled to the leads of the lead frame, and the leads are partly exposed to the outside of the encapsulation body for electrically coupling to an external printed circuit board. One drawback to this type of semiconductor package structure, however, is that, since the entire chip and the die pad are encapsulated within the encapsulation body, its heat-dissipation efficiency is considerably low.

One solution to the foregoing problem is to provide a heat sink or heat slug in the encapsulation body to help increase the heat-dissipation efficiency. One drawback to this solution, however, is that it significantly increase the overall weight of the package structure and would make the overall packaging process more complex to implement.

One solution to the problem of low heat-dissipation efficiency is to expose the die pad to the outside of the encapsulation body, such as the package configuration disclosed in the U.S. Pat. No. 5,252,783, which is briefly depicted in FIG. 5. As shown, the patented package configuration includes a lead frame 1 having a die pad 10 whose bottom surface 100 is exposed to the outside of the encapsulation body 2, allowing the chip-produced heat during operation to be dissipated directly through the die pad 10 to the atmosphere, so that no heat sink or heat slug is needed. This patented package configuration, however, has several drawbacks. First, since the bottom surface 100 of the die pad 10 should be exposed to the outside of the encapsulation body 2 and the edge of the bottom surface 100 would be rounded during stamping process, resin flash would easily occur at the peripheral edge of the bottom surface 100 of the die pad 10 during encapsulation process, which would adversely affect the quality and reliability of the finished product of the semiconductor package. Second, the post-treatments for removing the flashed resin require the use of sanding means or laser means, which would considerably increase the overall manufacture cost and may degrade the package quality. Third, the patented package configuration is unsuitable for use with large-size chips. This is because that when the die pad 10 is made larger in dimension, it would interfere the operation of the ejection pins used to eject the encapsulation body from the molds, undesirably causing the forming of a gap between the bottom surface of the die pad and the inner surface of the molds, which would then cause resin flash. Fourth, the exposed design for the die pad would easily allow ambient moisture to enter into the inside of the encapsulation body, which may degrade the internal circuitry of the semiconductor chip.

SUMMARY OF THE INVENTION

It is therefore an objective of this invention to provide a semiconductor package structure, which can help prevent resin flash during encapsulation process.

It is another objective of this invention to provide a semiconductor package structure, which allows no post-treatments to remove flashed resin so that the overall packaging process can be more cost-effective and less complex to implement.

It is still another objective of this invention to provide a semiconductor package structure, which allows no interference to the ejection pins.

It is yet another objective of this invention to provide a semiconductor package structure, which is suitable for use with large-size semiconductor chips.

It is still yet another objective of this invention to provide a semiconductor package structure, which can help prevent ambient moisture to enter into the inside of the encapsulation body.

In accordance with the foregoing and other objectives, the invention proposes a new semiconductor package structure. The semiconductor package structure of the invention comprises: a lead frame having a die pad and a plurality of leads, the die pad having a front surface and a bottom surface, with the bottom surface being formed with a cutaway portion at the peripheral edge thereof; a semiconductor chip mounted on the front surface of the die pad and electrically coupled to the leads; and an encapsulation body for encapsulating the semiconductor chip and part of the leads, with the bottom surface of the die pad being exposed to the outside of the encapsulation body. The cutaway portion can serve as a constricted passage when the die pad is clamped between a pair of encapsulating molds, so that the molding resin injected into the encapsulating molds would be slowed down in flow speed within the cutaway portion since the molding resin within the cutaway portion would be able to more quickly absorb the heat of the molds, thereby increasing its viscosity. As a result, the molding resin would less likely flash onto the bottom surface of the die pad. As a result, the finished semiconductor package structure would be more cost-effective to implement and more assured in quality and reliability.

The cutaway portion can be either formed in a single-step shape or a multi-step staircase-like shape, whose length is preferably from 0.4 mm to 1.2 mm and whose depth is preferably from 0.05 mm to 0.12 mm.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, three preferred embodiments are disclosed in full details in the following with reference to FIGS. 1–2, FIG. 3, and FIG. 4, respectively.

First Preferred Embodiment

The first preferred embodiment of the invention is disclosed in fill details in the following with reference to FIGS. 1–2.

Figure 1:
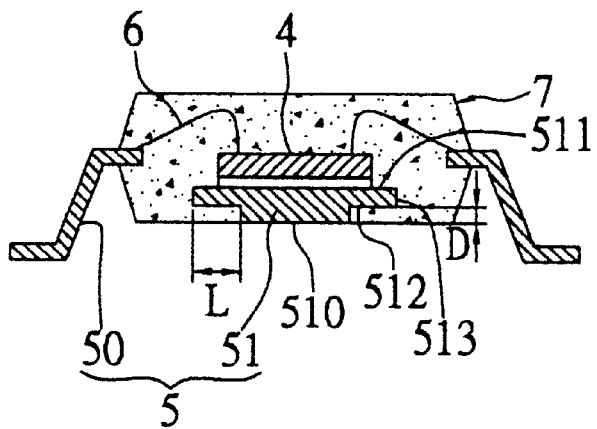
FIG. 1 is a schematic sectional diagram of a first preferred embodiment of the semiconductor package structure of the invention.

Referring to FIG. 1, the semiconductor package structure of the invention includes a semiconductor chip 4; a lead frame 5 having a plurality of leads 50 and a die pad 51; a plurality of gold wires 6 for electrically coupling the chip 4 to the leads 50; and an encapsulation body 7 for encapsulating the chip 4, the gold wires 6, and part of the lead frame 5.

The die pad 51 of the lead frame 5 has a bottom surface 510 and a front surface 511. The chip 4 is attached by means of silver paste or polyimide tape onto the front surface 511 of the die pad 51. The bottom surface 510 of the die pad 51 is formed with a cutaway portion 512 at the peripheral edge 513 thereof, whose length L is preferably from 0.4 mm to 1.2 mm (millimeter) and whose depth D is preferably from 0.05 mm to 0.12 mm. This cutaway portion 512 can serve as a constricted passage when the die pad 51 is clamped between a pair of encapsulating molds, so that the molding resin injected into the encapsulating molds would be slowed down in flow speed within the cutaway portion 512 since the molding resin within the cutaway portion 512 would be able to more quickly absorb the heat of the encapsulation molds, thereby increasing its viscosity so that it would less likely flash onto the bottom surface 510 of the die pad 51. As a result, the finished semiconductor package structure would be more cost-effective to implement and more assured in quality and reliability.

Moreover, the provision of the cutaway portion 512 can prevent ambient moisture from entering into the inside of the encapsulation body 7, which would otherwise cause damage to the chip 4. Therefore, it is unnecessary to make the die pad 51 larger in area than the chip 4, i.e., the die pad 51 can be substantially made equal or smaller in area than the chip 4. This benefit allows a reduction in material cost, making the overall manufacture process more cost-effective to implement.

To allow the overall semiconductor package structure to be compact in size, the die pad 51 is arranged at a downset position with respect to the leads 50. This allows the encapsulation body 7 to be formed to a smaller thickness. Moreover, this allows the overall length of the gold wires 6 to be reduced to save material cost.

Figure 2:
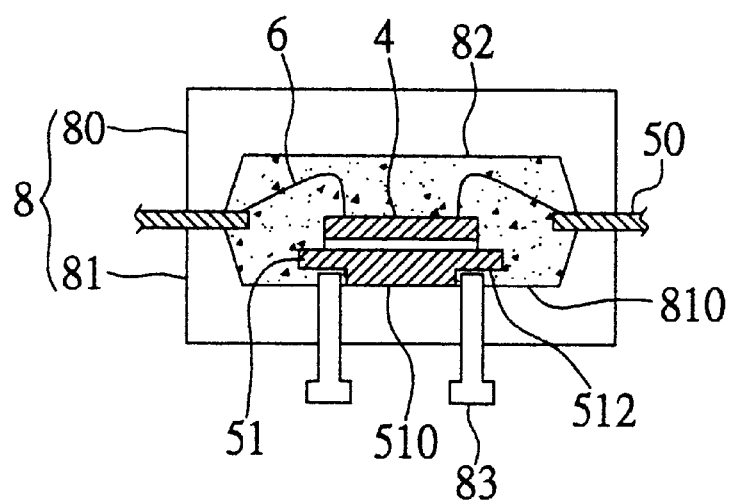
FIG. 2 is a schematic sectional diagram used to depict an encapsulation process for the semiconductor package structure of FIG. 1.

Referring further to FIG. 2, in the encapsulation process, an encapsulation tool set 8, which includes a top mold 80 and a bottom mold 81, is used to form the encapsulation body 7. During this process, the leads 50 are clamped between the top mold 80 and the bottom mold 81, with the recessed portion 82 accommodating the chip 4, the gold wires 6, and the die pad 51. After the encapsulation process is completed, ejection pins 83 are used to eject the encapsulation body 7 from the encapsulation tool set 8. Due to the forming of the cutaway portion 512, the ejection pins 83 can be abutted on those portions of the bottom surface 510 of the die pad 51 at the cutaway portion 512. This allows no gaps to be formed between the bottom surface 510 of the die pad 51 and the inner surface 810 of the bottom mold 81, that would otherwise allow the molding resin to flash to the bottom surface 510 of the die pad 51. The invention is therefore more advantageous to use than the prior art.

Second Preferred Embodiment

Figure 3:
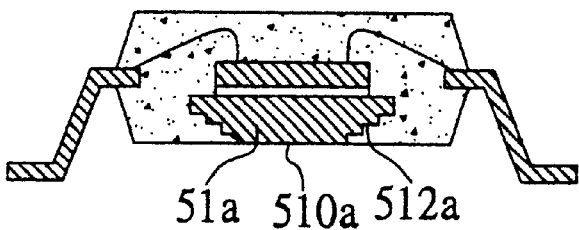
FIG. 3 is a schematic sectional diagram of a second preferred embodiment of the semiconductor package structure of the invention.

The second preferred embodiment of the invention is disclosed in full details in the following with reference to FIG. 3. In FIG. 3, similar parts as the previous embodiment are labeled with the same reference numerals appended with "a".

This embodiment differs from the previous one only in that the top surface of the die pad 51a is substantially leveled with the leads 50a in position, so that the die pad 51a can be made more thick for the forming of a multi-step staircase-like cutaway portion 512a. During the encapsulation process, the staircase-like shape of the cutaway portion 512a allows the molding resin to be able to more quickly absorb the heat of the encapsulation molds, so that the molding resin can be more quickly increased in viscosity and reduced in flow speed within the cutaway portion 512a, allowing the bottom surface 510a of the die pad 51a to be substantially flash free.

Third Preferred Embodiment

Figure 4:
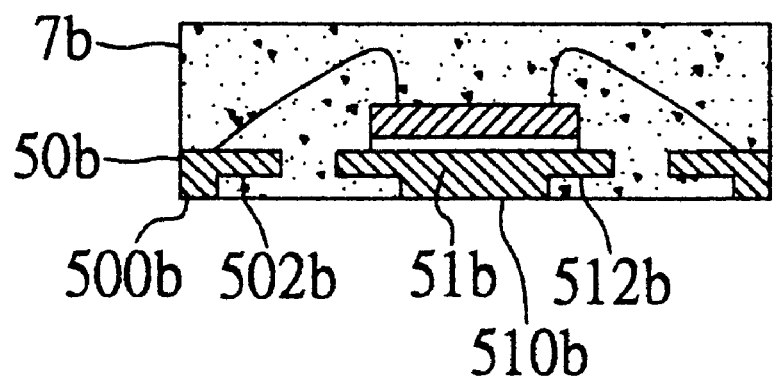
FIG. 4 is a schematic sectional diagram of a third preferred embodiment of the semiconductor package structure of the invention.
Figure 5:
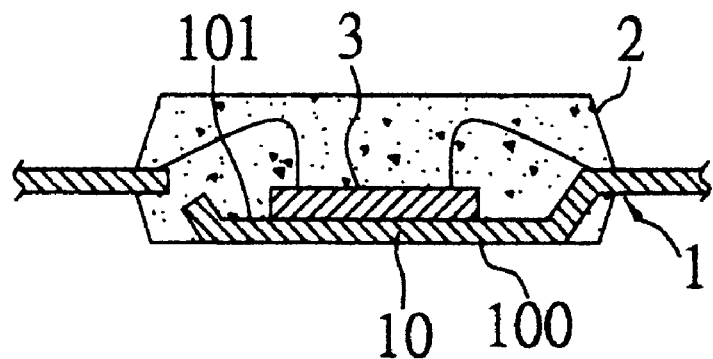
FIG. 5 (PRIOR ART) is a schematic sectional diagram of a conventional semiconductor package structure.

The third preferred embodiment of the invention is disclosed in full details in the following with reference to FIG. 4. In FIG. 4, similar parts as the previous embodiments are labeled with the same reference numerals appended with "b".

This embodiment differs from the previous ones in that the die pad 57b and the leads 50b are both exposed to the outside of the encapsulation body 7b and the die pad 51b is substantially leveled with the leads 50b in position, and in that both the die pad 51b and the leads 50b are formed with cutaway portions 512b and 502b which can help prevent resin flash on the bottom side 510b of the die pad 51b and the bottom side 500b of the leads 50b.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package structure, which comprises:

a lead frame having a die pad and a plurality of leads, the die pad having a front surface and a bottom surface, with the bottom surface being formed with a cutaway portion at the peripheral edge thereof, the cutaway portion for preventing resin flash on the bottom surface of the die pad;

a semiconductor chip mounted on the front surface of the die pad and electrically coupled to the leads; and an encapsulation body for encapsulating the semiconductor chip and part of the leads, with the bottom surface of the die pad being exposed to the outside of the encapsulation body.

2. The semiconductor package structure of claim 1, wherein the cutaway portion, is formed in a single-step shape.

3. The semiconductor package structure of claim 1, wherein the cutaway portion is formed in a multi-step staircase-like shape.

4. The semiconductor package structure of claim 1, wherein the die pad is arranged at a downset position with respect to the leads.

5. The semiconductor package structure of claim 1, wherein the leads have one side exposed to the outside of the encapsulation body.

6. The semiconductor package structure of claim 5, wherein the leads are formed with a cutaway portion at the peripheral edge thereof.

7. The semiconductor package structure of claim 1, 2, or 3, wherein the cutaway portion is dimensioned to a length of from 0.4 mm to 1.2 mm and a depth of from 0.05 mm to 0.12 mm.

\* \* \* \* \*